(12) United States Patent
Pelletier et al.

(10) Patent No.: US 8,610,424 B2
(45) Date of Patent: Dec. 17, 2013

(54) CLOSING OF AN HF CUT-OFF MEMBER

(75) Inventors: Aude Pelletier, Issy les Moulinieaux (FR); Jean-Michel Moulard, Saint Nom le Breteche (FR)

(73) Assignee: Electricite de France, Paris (FR)

( * ) Notice: Subject to any disclaimer, the term of this patent is extended or adjusted under 35 U.S.C. 154(b) by 330 days.

(21) Appl. No.: 12/994,564

(22) PCT Filed: May 28, 2009

(86) PCT No.: PCT/FR2009/051008
§ 371 (c)(1),
(2), (4) Date: Nov. 24, 2010

(87) PCT Pub. No.: WO2009/156656
PCT Pub. Date: Dec. 30, 2009

(65) Prior Publication Data
US 2011/0095746 A1   Apr. 28, 2011

(30) Foreign Application Priority Data
May 29, 2008 (FR) .................................. 08 53545

(51) Int. Cl.
*G01R 19/00* (2006.01)

(52) U.S. Cl.
USPC ...................................................... 324/76.11

(58) Field of Classification Search
USPC .......... 324/142, 762.01–762.1, 764.01, 76.11
See application file for complete search history.

(56) References Cited

U.S. PATENT DOCUMENTS 7,502,698 B2 *  3/2009  Uenou et al. .................... 702/60

FOREIGN PATENT DOCUMENTS

| EP | 0 084 634 A1 | 8/1983 |
| ES | 2 063 699 A2 | 1/1995 |
| JP | 11-273538 A | 10/1999 |

* cited by examiner

*Primary Examiner* — Tung X Nguyen
(74) *Attorney, Agent, or Firm* — Drinker Biddle & Reath LLP

(57) ABSTRACT

An electronic meter for electric power having a controlled reclosing of the cut-off member by a circuit breaker of a subscriber. The meter comprises, on at least one phase, a circuit generating HF to the wiring of a subscriber via the cut-off member in open position and the circuit breaker, and a circuit for controlling the closing of the cut-off member upon a detection of the HF current cancellation when opening the circuit breaker of a subscriber. The invention can be used for electronic meters not accessible to the subscriber.

5 Claims, 3 Drawing Sheets

CLOSING OF AN HF CUT-OFF MEMBER

CROSS-REFERENCE TO RELATED APPLICATIONS

This application is the U.S. national phase of the International Patent Application No. PCT/FR2009/051008 filed May 28, 2009, which claims the benefit of French Application No. 08 53545 filed May 29, 2008, the entire content of which is incorporated herein by reference.

FIELD OF THE INVENTION

The invention relates to a meter for electric power having a device for closing of the cut-off member of this meter by action on a circuit breaker of the client service line, separating the distribution network from the client's domestic network.

BACKGROUND

Currently, residential clients subscribed to electricity distribution are generally connected to the electric power distribution network and have a service line circuit breaker and a meter for electric power.

The meter is an element for measuring and recording consumption of electric power. It can be installed inside or outside the premises, at the boundary of the property or in a common place in a building. An electric power meter situated outside the premises is called "inaccessible" to the subscriber client or to all of the latter occupying a building. In France in 2007 this situation represents approximately 50% of the residential clientele.

The service line circuit breaker is the protection and safety element which is always situated in the premises, so as to be directly accessible to the subscriber clients. The opening of this circuit breaker is automatic in order protect against a fault, for example in the case of a short-circuit, but also when the power consumed exceeds the power contractually subscribed and also to switch off the power to the client wiring.

Managers of the electricity distribution network envisage offering meters for electric power that are inaccessible to the client, the purpose of which is to provide a simple and effective solution making it possible to reclose the cut-off member of the meter remotely, from the domestic wiring directly accessible to the subscriber clients in the premises of the latter.

The principle consisting of reclosing the cut-off member of the meter by acting on the service line circuit breaker of the client wiring has been described by Circutor, a company under Spanish law.

In particular, the company Circutor is the proprietor of Spanish Patent Application ES 2063699, the subject of which is to counter any possible fraud by the subscriber client involving his circuit breaker installed inside the premises.

The interior circuit breaker situated within the premises is accessible to the subscriber client and the latter therefore is able to fraudulently change the setting, in order to have a higher power than that contractually subscribed.

In order to guard against such an attempt, the solution described in the Circutor patent consists of installing a second circuit breaker outside the premises, inaccessible to the subscriber client, to which is added a device allowing remote reconnection to be carried out, as shown in FIG. 1a.

The additional external circuit breaker is strictly identical to the interior circuit breaker and set to the same cut-off value corresponding to the contractually subscribed power. In the event that the subscriber client fraudulently sets the power of his interior circuit breaker to a value greater than the subscribed power, the opening of the external circuit breaker ensures the correct limitation of power to the contractual value. The reconnection circuit then allows the subscriber clients to easily reclose the external circuit breaker from their premises by actuating their interior circuit breaker.

Such a procedure is implemented from a reconnection circuit installed in the external circuit breaker of magneto-thermal type, identical to that which is situated within the premises. The reconnection circuit is constituted for each phase and for the neutral, of a resistor, a relay and a motor actuated by the relay as shown in FIG. 1b, for the phase for example.

Following the opening of the external circuit breaker by the subscriber client, this opening generates a current i', denoted subscriber network reclosing current, the single-phase value of which is given by the relationship (1):

$$i' = \frac{U_{network}}{2R + Z_{premises}}$$

in the above relationship $U_{network}$ denotes the voltage of the network and $Z_{premises}$ denotes the equivalent impedance of the wiring of the premises in question. The current intensity value i' is given in the case where a reconnection circuit comprising the resistance R is present on the phase and on the neutral.

In this situation, when the subscriber client opens the interior circuit breaker, the intensity i' becomes zero and the passage to zero of the above-mentioned intensity is detected by the relay, which actuates the motor. The latter mechanically recloses the external circuit breaker. The closing of the interior circuit breaker by the subscriber client allows the latter to switch on the power to the domestic wiring again.

Of course such a procedure can be implemented in an electric power meter. Such a solution was exhibited at the Metering Europe 2006 trade show by Circutor. In this situation the cut-off member only cuts off the phase, creating a current expressed, according to the relationship (2) in the form:

$$i' = \frac{U_{network}}{R + Z_{premises}}$$

Where $U_{network}$ is the voltage of the network and $Z_{network}$ is the equivalent impedance of the premises in question.

The above-mentioned solution allows the reconnection of the power to the domestic wiring of the subscriber client, the meter of which is inaccessible. To this end, the service line circuit breaker, still positioned inside the premises, is therefore accessible to the client and plays an intermediary role.

The operation of the system as previously described and in particular of the reconnection circuit has the following drawbacks:
  the operation of the above system is dependent upon the correct dimensioning of the resistor R of the reconnection circuit. In particular, the impedance of the domestic wiring of the premises varies from one subscriber client to another and over the course of time for one client; and,
  the intensity i' must be sufficiently high in order to be detected by the current-detection systems of the meter. However, the higher the above-mentioned intensity i', the more the technical losses increase. It is therefore necessary both to identify the range of the impedance of the domestic wiring of the premises and the minimum acceptable value for this current i'. A current i' greater than 10 milliamps would a priori appear to be necessary;

the technical losses are those generated between the time when the cut-off member opens and the time when the subscriber client opens his interior circuit breaker, a low current being generated by the meter towards the interior of the premises. The above-mentioned technical losses are estimated at approximately 2 W.

Moreover, even in the case where the subscriber client is not authorized to reclose his cut-off member via his internal circuit breaker, when for example this subscriber client is a debtor having an outstanding account, the above-mentioned current is generated regardless, due to the electric architecture of the reconnection circuit.

Finally, whatever the reason, it is possible, in certain cases, that the cut-off member of a meter remains open while the circuit breaker is kept closed. In such a situation, the low current permanently generated causes technical losses of electric power, which can increase, the longer the cut-off continues.

By way of non-limitative example, on French territory, comprising 50% of clients whose meter is inaccessible and for approximately 1% of these clients whose contract is suspended over one year, there are approximately 170,000 meters permanently consuming 2 W, i.e. a loss of electric power of 3 GWh per year.

SUMMARY

A subject of the present invention is to remedy the above drawbacks.

In particular, a subject of the present invention is the implementation of an electronic meter for electric power of a subscriber wiring that has controlled reclosing of the cut-off member via a circuit breaker of a subscriber having all of the functionalities of the meters of the prior art, but in which the drawbacks of the existence of a subscriber network reclosing current are substantially overcome.

In particular, a further subject of the present invention is the implementation of an electronic meter for electric power of a subscriber wiring that has reclosing of the cut-off member via a circuit breaker of a subscriber, in which a total galvanic isolation of the phase is introduced during the detection of the opening/closing of the circuit breaker of a subscriber, in the total absence of a subscriber network reclosing current at 50 Hz for carrying out the above-mentioned execution of the detection.

The electronic meter for electric power of a subscriber wiring having a controlled reclosing of the cut-off member via a circuit breaker of a subscriber that is the subject of the present invention, is remarkable in that it comprises, on at least one phase, a circuit generating an HF current to the subscriber wiring via the cut-off member in open position and the circuit breaker of a subscriber and a circuit for controlling the closing of the cut-off member, upon a detection of the HF current cancellation, when opening the circuit breaker of a subscriber by the subscriber client.

The electronic meter for electric power that is the subject of the invention is moreover remarkable in that the generating circuit comprises at least an HF oscillator delivering an HF voltage to the primary winding of an isolating transformer and an HF connection circuit formed by the secondary winding of the isolating transformer. This secondary winding being linked by a first coupling capacitor, on the one hand, to the open contact of the cut-off member, and, on the other hand, by a second coupling capacitor to a resistance circuit for the detection of the HF, current-linking the coupling capacitor to neutral.

The electronic meter that is the subject of the invention is moreover remarkable in that the circuit for controlling the closing comprises at least one circuit for the measurement of the HF voltage and the intensity of the HF current at the terminals of and respectively flowing in the resistance circuit for the detection of this HF current and a logic circuit for controlling the closing of the cut-off member, dependent upon the intensity value of the measured HF current.

The electronic meter that is the subject of the invention is finally remarkable in that, for an electronic meter comprising a resource for the transmission of digital data by power-line carrier currents, the HF oscillator is constituted by the oscillator delivering the HF carrier signal of the power-line carrier currents.

BRIEF DESCRIPTION OF THE DRAWINGS

The electronic meter for electric power having a controlled reclosing of the cut-off member via a circuit breaker of a subscriber that is the subject of the invention will be better understood, on reading the description and on viewing the drawings, as well as FIGS. 1a and 1b relating to the prior art.

FIG. 2b shows, purely by way of illustration, a detail of implementation of the electronic meter arrangement that is the subject of the invention shown in FIG. 2a;

DETAILED DESCRIPTION

A more detailed description of the electronic meter for electric power of a subscriber wiring having a controlled reclosing of the cut-off member via a circuit breaker of a subscriber, according to the subject of the present invention, will now be given with reference to FIG. 2a and the following figures.

Figure 1A:
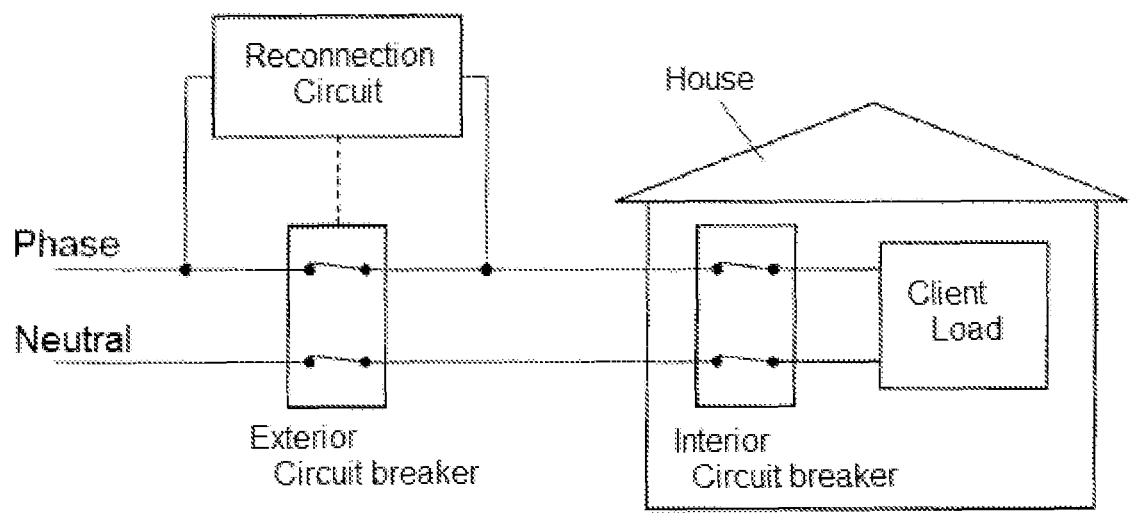
Figure 1B:
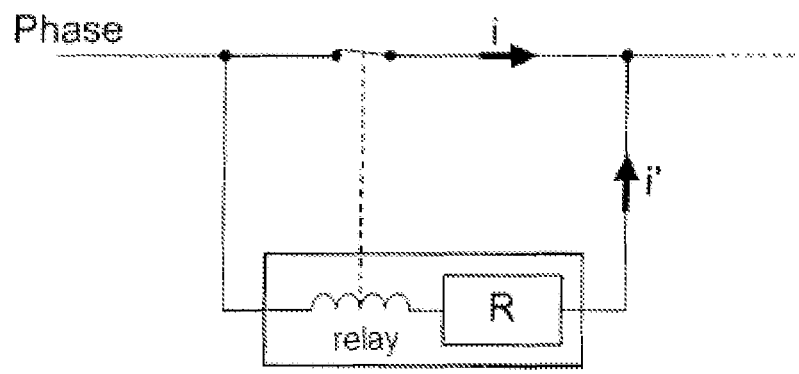
Figure 2A:
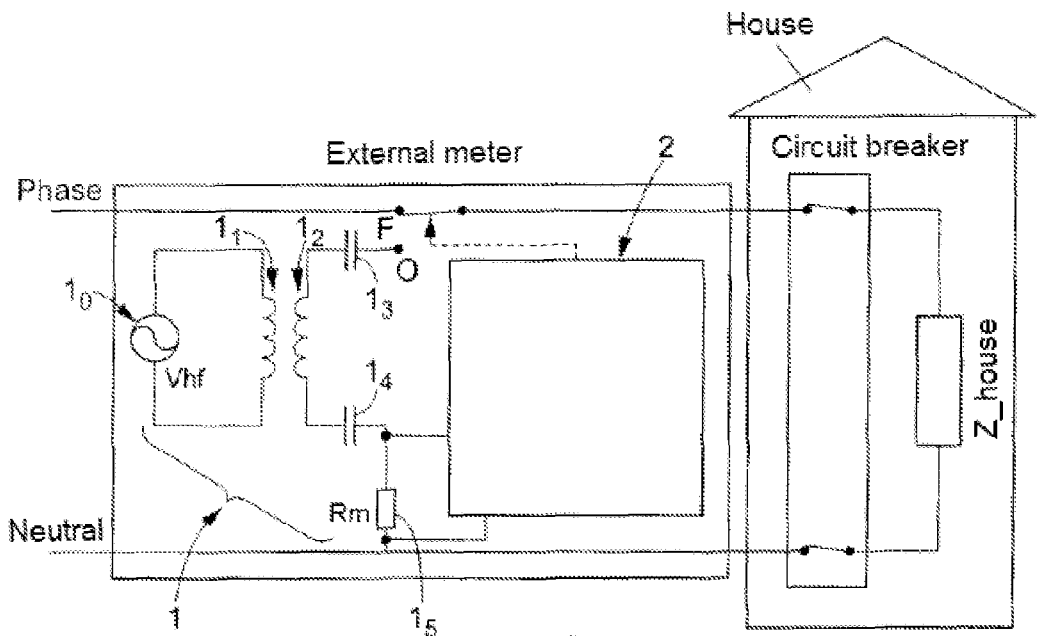
FIG. 2a shows, purely by way of illustration, an electronic meter arrangement according to the subject of the present invention.

As shown in FIG. 2a, the above-mentioned meter is an external meter of a residential house.

The wiring of the subscriber in the residential house comprises in standard fashion a circuit breaker, controlled automatically and manually, and all the domestic wiring, the equivalent impedance of which is marked Z_house.

The electronic meter for electric power that is the subject of the invention comprises, apart from the conventional circuits for metering electric power and transmission-reception of digital data required for managing the meter and the set of functions of the latter, these circuits not being shown on the drawing in order not to complicate the picture, a circuit 1 generating an HF current to the wiring of a subscriber via the cut-off member, marked OC, when the latter is in the open position, marked O, and the circuit breaker of a subscriber, when the latter is in the closed position. It is understood, in particular, that conversely, when the cut-off member OC is in the closed position F, the wiring of the subscriber is supplied with electric power via the circuit breaker.

As shown moreover in FIG. 2a, the electronic meter that is the subject of the invention comprises a circuit 2 controlling the execution of a closing command of the cut-off member OC, upon a detection of the HF current cancellation, on opening the circuit breaker of a subscriber by the subscriber client.

As is shown moreover in greater detail in FIG. 2a, the generating circuit 1 comprises at least one HF oscillator $1_0$ which delivers an HF voltage to the primary winding $1_1$ of an isolating transformer T.

The generating circuit 1 comprises moreover an HF connection circuit formed by the secondary winding $1_2$ of the isolating transformer T. This secondary winding is linked by a first coupling capacitor $1_3$ to the open contact O of the cut-off member OC. The above-mentioned secondary winding $1_2$ is moreover linked to a resistance circuit $1_5$ for detection of the HF current by a second coupling capacitor $1_4$, the resistance circuit $1_5$ being linked to the neutral.

Moreover, the resistance circuit $1_5$ is connected to the circuit 2 for controlling the closing of the cut-off member in order to trigger the above-mentioned closing command.

Figure 2B:
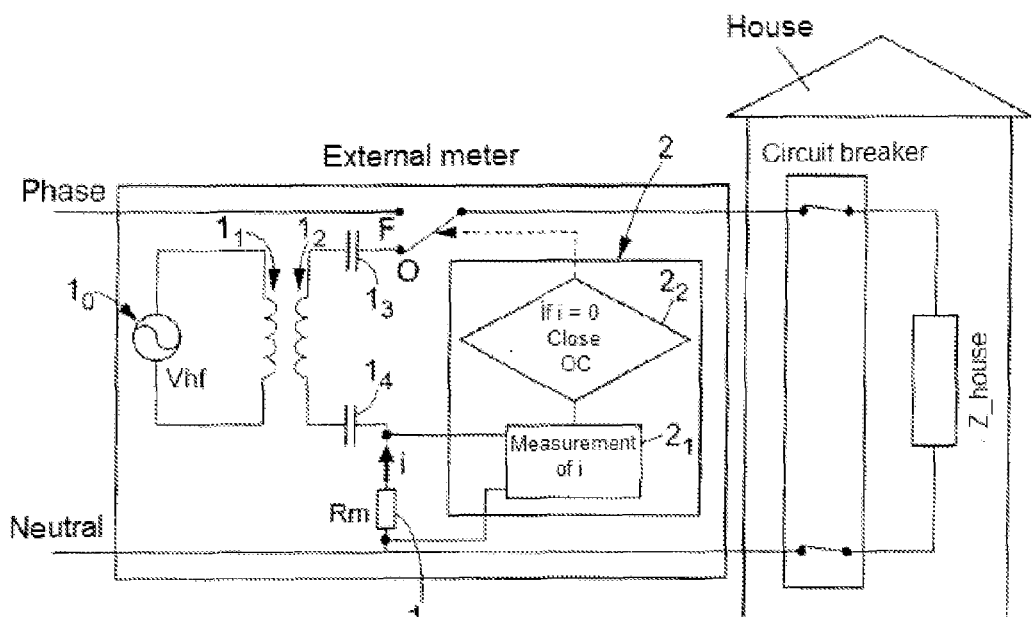

As shown in more detail in FIG. 2b, the circuit 2 for controlling the closing advantageously comprises a circuit $2_1$ for measuring the HF voltage and the intensity of the HF current at the terminals and flowing in the resistance circuit $1_5$ for the detection of this HF current. The above-mentioned measurement circuit is connected to a logic circuit for controlling the closing $2_2$ of the cut-off member OC dependent upon the intensity value of the HF current measured in the resistance circuit $1_5$.

By way of non-limitative example, the measurement circuit $2_1$ can be formed by a sampling circuit accompanied by an analogue-to-digital converter, which delivers digital values representative of the intensity value of the HF current flowing in the resistance circuit $1_5$.

With respect to the control logic circuit $2_2$, it should be noted that this is a comparator circuit comparing the measured intensity value of the HF current to the zero value.

If the intensity value i=0 is detected when the subscriber of the circuit breaker has manually manipulated the circuit breaker to the open position, the cut-off member OC in open position O is then commanded to close, position F, using the logic circuit $2_2$ for controlling the closing. Under these conditions, the supply of electric power to the wiring of the subscriber can then be provided via the circuit breaker, returned to the closed position.

More specifically, it is stated that the control logic circuit $2_2$ is advantageously coupled to an electromechanical element actuating the cut-off member OC in order to bring the latter into the closed position F.

A variant implementation of the electronic meter that is the subject of the invention is now described with reference to FIG. 2c.

This variant implementation relates to electronic meters for electric power having resources for the transmission-reception of digital data by power-line carrier current, commonly denoted PLC.

Figure 2C:
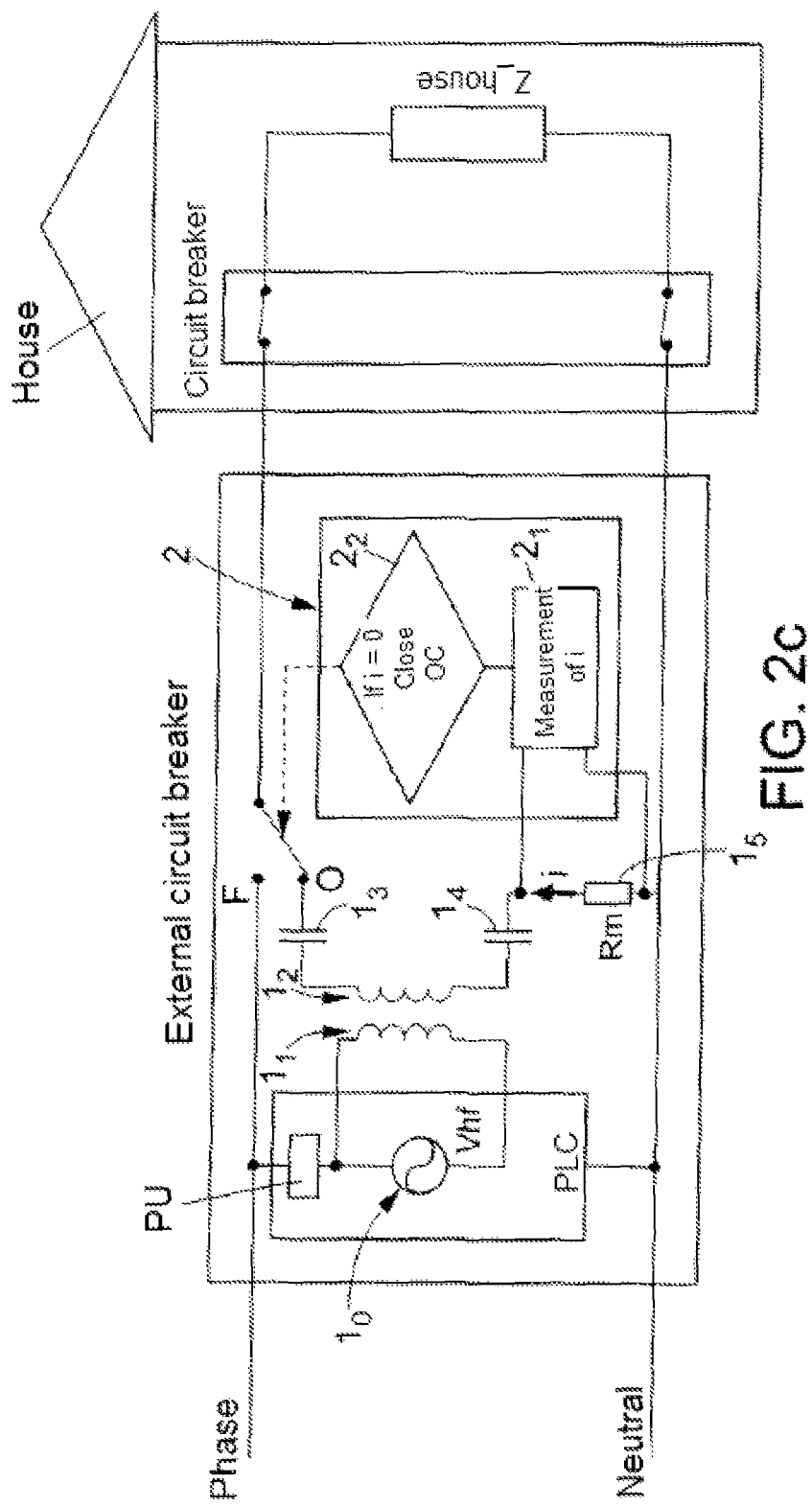
FIG. 2c shows a preferred variant implementation of the electronic meter that is the subject of the invention, in the case of an electronic meter equipped with resources for the transmission of data by power-line carrier currents.

In this situation, the meter that is the subject of the invention has a power-line carrier currents unit, marked PLC in FIG. 2c, which of course is equipped with an HF oscillator delivering a carrier signal having a frequency comprised between 3 kHz and 148.5 kHz. This PLC unit is equipped with a unit PU for processing the carrier signal, in order to transmit the digital data over the phase line and the neutral in standard fashion.

However, according to a remarkable aspect of the electronic meter that is the subject of the invention, the HF oscillator as described in FIG. 2a or 2b is constituted by the oscillator delivering the HF carrier signal of the power-line carrier currents.

It is of course understood that, in the preferred non-limitative embodiment of FIG. 2c, the electronic meter that is the subject of the invention allows a simplified implementation using the existing resources of the standard type of meter.

Generally, it is stated that the electronic meter that is the subject of the invention is a single-phase, three-phase or multiphase meter. In the case of a three-phase or multiphase meter, the circuits shown in FIGS. 2a, 2b and 2c can be replicated for several phases.

While the electronic meter that is the subject of the invention implements the set of functions of the devices of the prior art as described previously in the description, it should be noted that the latter moreover makes it possible to optimize two major aspects:

the consumption of electricity;
the isolation of the phase(s) of the meter.

In particular, the advantages hereafter are obtained thanks to the implementation of the electronic meter that is the subject of the invention:

the transmission of the high-frequency current is not carried out to the detriment of the dielectric isolation of the cut-off member OC, contrary to the solution of the prior art, which introduces a circuit which can potentially short-circuit the open cut-off member;

the galvanic isolation of the phase(s) makes it possible to dispense with the transmission of currents at 50 Hz which flow for the detection of the opening/closing of the circuit breaker in the solution of the prior art. This feature makes it possible to retain a genuine galvanic isolation when the cut-off member OC of the meter is open;

this solution makes it possible to reduce the electricity consumption due to the transmission of the detection signal by a factor of approximately 1000. In fact, the maximum permitted transmission power on the CENELEC A band (band of frequencies comprised between 9 kHz and 95 kHz) is 134 dBµV, which corresponds over a 50 ohms impedance network to a power of 2 mW. This value is to be compared to the estimated consumption of the reconnection system of the prior art described in the introduction to the description, which is of the order of 2 W;

adopting an optimal strategy for transmissions moreover allows these consumptions to be reduced. In fact, it is possible for the transmission of the high frequency signal only to take place over certain time windows, at a given frequency, thus reducing electricity consumption;

transmitting the detection signal only when this proves necessary, according to the parametering of the meter, also makes it possible to optimize the consumption of electricity. For example, when the meter is not authorized to perform the closing order of the cut-off member OC locally, when for example there is an absence of authorization due to unpaid accounts;

sharing the circuits of the meter. It is important here to recall that the meters of the future are equipped with transmission resources either for the transmission or reception of digital data by power-line carrier currents and it is particularly advantageous to use the generator of the carrier signal of the latter for the purpose of implementing the subject of the present invention.

The invention claimed is:

1. An electronic meter for electric power of a subscriber wiring having a controlled reclosing of the cut-off member via a circuit breaker of a subscriber, the electronic meter comprising, on at least one phase:

a circuit generating a current to the wiring of a subscriber via the cut-off member in open position and the circuit breaker of a subscriber; and a circuit for controlling the closing of the cut-off member, upon a detection of the current equaling zero, on opening of the circuit breaker by the subscriber client.

2. The meter of claim 1, wherein the generating circuit comprises at least:

an HF oscillator delivering a voltage to the primary winding of an isolating transformer; and an HF connection circuit formed by the secondary winding of the isolating transformer, the secondary winding being linked on the one hand, by a first coupling capacitor, to the open contact of the cut-off member, and, on the other hand, by a second coupling capacitor to a resistance circuit for the detection of the current linking the second coupling capacitor to neutral.

3. The meter of claim 2, wherein the circuit for controlling the closing comprises at least:

a circuit for the measurement of the voltage at the terminals of the resistance circuit and the intensity of the current flowing in the resistance circuit;

a logic circuit for controlling the closing of the cut-off member according to the intensity value of the measured current.

4. The meter of claim 3, wherein the logic circuit is coupled to an electromechanical actuator of the cut-off member.

5. The meter of claim 2, wherein the electronic meter comprises a resource for the transmission of digital data by power-line carrier currents and the HF oscillator is constituted by an oscillator delivering the HF carrier signal of the power-line carrier currents.

* * * * *